(12) United States Patent
Kawasaki et al.

(10) Patent No.: US 10,264,677 B2
(45) Date of Patent: Apr. 16, 2019

(54) ELECTRONIC COMPONENT AND MANUFACTURING METHOD THEREFOR

(71) Applicant: Murata Manufacturing Co., Ltd., Nagaokakyo-shi, Kyoto-fu (JP)

(72) Inventors: Koichiro Kawasaki, Nagaokakyo (JP); Taku Kikuchi, Nagaokakyo (JP); Takashi Kitahara, Nagaokakyo (JP); Hiroki Noto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/610,658

(22) Filed: Jun. 1, 2017

(65) Prior Publication Data

US 2017/0273183 A1 Sep. 21, 2017

Related U.S. Application Data

(63) Continuation of application No. PCT/JP2015/083434, filed on Nov. 27, 2015.

(30) Foreign Application Priority Data

Dec. 4, 2014 (JP) ................................. 2014-245792

(51) Int. Cl.
*H05K 1/00* (2006.01)
*H05K 1/18* (2006.01)
(Continued)

(52) U.S. Cl.
CPC .............. *H05K 1/18* (2013.01); *H01L 23/00* (2013.01); *H01L 23/28* (2013.01); *H01L 23/34* (2013.01);
(Continued)

(58) Field of Classification Search
CPC ...... H05K 1/0203; H05K 1/0216; H05K 1/18; H05K 3/284; H05K 3/30;
(Continued)

(56) References Cited

U.S. PATENT DOCUMENTS

2010/0044100 A1* 2/2010 Ono ....................... H05K 3/284
174/521
2010/0225202 A1 9/2010 Fukano et al.
(Continued)

FOREIGN PATENT DOCUMENTS

JP 2005-184309 A 7/2005
JP 2012-028484 A 2/2012
(Continued)

OTHER PUBLICATIONS

Official Communication issued in International Patent Application No. PCT/JP2015/083434, dated Jan. 19, 2016.

*Primary Examiner* — Mukundbhai G Patel
*Assistant Examiner* — Zhengfu J Feng
(74) *Attorney, Agent, or Firm* — Keating & Bennett, LLP

(57) ABSTRACT

An electronic component includes an electronic component element including first and second main surfaces, a heat-dissipation accelerating member on the first main surface, a sealing resin layer sealing the electronic component element, and a shielding member provided on the sealing resin layer and electrically connected to the heat-dissipation accelerating member. The heat-dissipation accelerating member includes fourth and fifth main surfaces. The electronic component includes a connecting member disposed on the fifth main surface of the heat-dissipation accelerating member and electrically connecting at least one portion of the heat-dissipation accelerating member and the shielding member. The connecting member has a higher thermal conductivity than the sealing resin layer. The contact area between the heat-dissipation accelerating member and the
(Continued)

connecting member is smaller than the area of the fifth main surface.

19 Claims, 9 Drawing Sheets

(51) Int. Cl.
| | |
|---|---|
| *H01L 23/00* | (2006.01) |
| *H01L 23/28* | (2006.01) |
| *H01L 23/34* | (2006.01) |
| *H03H 3/08* | (2006.01) |
| *H04B 1/38* | (2015.01) |
| *H01L 41/047* | (2006.01) |
| *H03H 9/02* | (2006.01) |
| *H05K 1/02* | (2006.01) |
| *H05K 3/28* | (2006.01) |
| *H05K 3/30* | (2006.01) |
| *H03H 9/05* | (2006.01) |
| *H03H 9/10* | (2006.01) |

(52) U.S. Cl.
CPC ............ *H01L 41/047* (2013.01); *H03H 3/08* (2013.01); *H03H 9/02834* (2013.01); *H03H 9/059* (2013.01); *H03H 9/0542* (2013.01); *H03H 9/1071* (2013.01); *H04B 1/38* (2013.01); *H05K 1/0203* (2013.01); *H05K 1/0216* (2013.01); *H05K 3/284* (2013.01); *H05K 3/30* (2013.01); *H01L 2924/0002* (2013.01); *H05K 2201/0707* (2013.01); *H05K 2201/1003* (2013.01); *H05K 2201/10015* (2013.01); *H05K 2201/10378* (2013.01); *H05K 2201/10734* (2013.01)

(58) Field of Classification Search
CPC . H05K 2201/0707; H05K 2201/10015; H05K 2201/1003; H05K 2201/10378; H05K 2201/10734; H03H 9/1071; H03H 9/0542; H03H 9/02834; H03H 9/059; H03H 3/08; H01L 41/047; H01L 23/00; H01L 23/28; H01L 23/34; H01L 2924/0002; H04B 1/38
See application file for complete search history.

(56) References Cited

U.S. PATENT DOCUMENTS

| | | |
|---|---|---|
| 2011/0013349 A1 | 1/2011 | Morikita et al. |
| 2012/0241942 A1* | 9/2012 | Ihara ...................... H01L 24/73 257/712 |
| 2015/0036304 A1* | 2/2015 | Yamauchi ............ H01L 21/561 361/760 |

FOREIGN PATENT DOCUMENTS

| | | |
|---|---|---|
| JP | 2013-251323 A | 12/2013 |
| WO | 2009/057699 A1 | 5/2009 |
| WO | 2009/122835 A1 | 10/2009 |

\* cited by examiner

ELECTRONIC COMPONENT AND MANUFACTURING METHOD THEREFOR

CROSS REFERENCE TO RELATED APPLICATIONS

This application claims the benefit of priority to Japanese Patent Application No. 2014-245792 filed on Dec. 4, 2014 and is a Continuation Application of PCT Application No. PCT/JP2015/083434 filed on Nov. 27, 2015. The entire contents of each application are hereby incorporated herein by reference.

BACKGROUND OF THE INVENTION

1. Field of the Invention

The present invention relates to an electronic component including a shielding member and to a manufacturing method for the electronic component.

2. Description of the Related Art

Hitherto, an electronic component including a shielding member that provides an electromagnetic shielding function is widely used for an electronic device, such as a cellular phone.

For example, in the electronic component disclosed in International Publication No. 2009/122835, an electronic component element is mounted on a circuit substrate. A conductive post connected to a ground potential is provided on the electronic component element. The electronic component element is sealed by a resin layer. The top end of the conductive post extends to the surface of the resin layer. A shielding member is provided on the resin layer. The shielding member and the conductive post are electrically connected to each other.

In the electronic component disclosed in International Publication No. 2009/122835, among the members sealed by the resin layer, only the conductive post is a member having a high thermal conductivity. Thus, heat dissipation from the electronic component element is not sufficiently performed other than in the contact area between the conductive post and the electronic component element.

SUMMARY OF THE INVENTION

Preferred embodiments of the present invention provide an electronic component with high heat dissipation characteristics and a manufacturing method for the electronic component.

An electronic component according to a preferred embodiment of the present invention includes an electronic component element including first and second main surfaces which oppose each other; a heat-dissipation accelerating member that is disposed on the first main surface of the electronic component element and that is defined by a conductor; a mounting substrate including a third main surface which opposes the second main surface of the electronic component element, the electronic component element being mounted on the mounting substrate; a sealing resin layer disposed on the third main surface of the mounting substrate so as to seal the electronic component element; and a shielding member that is disposed at least on a surface of the sealing resin layer opposite a surface positioned on the mounting substrate and that is electrically connected to the heat-dissipation accelerating member. The heat-dissipation accelerating member includes a fourth main surface positioned close to the electronic component element and a fifth main surface which opposes the fourth main surface. The electronic component further includes a connecting member that is disposed on the fifth main surface of the heat-dissipation accelerating member and that electrically connects at least at one portion the heat-dissipation accelerating member and the shielding member with each other. The connecting member has a higher thermal conductivity than the sealing resin layer. A contact area between the heat-dissipation accelerating member and the connecting member is smaller than an area of the fifth main surface of the heat-dissipation accelerating member.

In an electronic component according to a preferred embodiment of the present invention, the fifth main surface of the heat-dissipation accelerating member and the sealing resin layer may contact each other. This makes it possible to physically stabilize the electronic component element effectively. Heat from the heat-dissipation accelerating member is able to also be released via the sealing resin layer, thus effectively enhancing heat dissipation.

In an electronic component according to a preferred embodiment of the present invention, the shielding member may cover an external area of the sealing resin layer so that the sealing resin layer is not exposed to the exterior. This configuration enables the shielding member to exhibit electromagnetic shielding characteristics more properly. Additionally, a large area of the shielding member contacts the exterior, thus effectively enhancing heat dissipation.

In an electronic component according to a preferred embodiment of the present invention, the connecting member may include a portion which is not connected to the shielding member, and the portion of the connecting member is exposed to the exterior. This configuration makes a path for heat dissipation to the exterior short in a region where the shielding member is partially opened, thus effectively enhancing heat dissipation.

In an electronic component according to a preferred embodiment of the present invention, the sealing resin layer may include a sixth main surface, which is the surface opposite the surface positioned on the mounting substrate. The connecting member may not be exposed to the exterior and may include a connecting end portion connected to the shielding member. The sixth main surface and the connecting end portion may be flush with each other, and the shielding member may include a portion provided on the sixth main surface and on the connecting end portion. This makes it possible to easily attract the electronic component by suction, for example, and to transfer it, thus effectively improving the productivity.

In an electronic component according to a preferred embodiment of the present invention, the shielding member may be connected to a ground potential. This enables the shielding member to exhibit electromagnetic shielding characteristics more properly, and heat dissipation is able to be effectively improved.

In an electronic component according to a preferred embodiment of the present invention, a circuit of the electronic component element and the heat-dissipation accelerating member may be electrically insulated from each other. This makes it possible to improve heat dissipation without impairing the functions of the electronic component.

In an electronic component according to a preferred embodiment of the present invention, the electronic component may further include a bonding agent that bonds the electronic component element and the heat-dissipation accelerating member to each other. This improves the bonding strength between the electronic component element and the heat-dissipation accelerating member.

In an electronic component according to a preferred embodiment of the present invention, the heat-dissipation accelerating member may be made of a metal. This improves heat dissipation more effectively.

In an electronic component according to a preferred embodiment of the present invention, the connecting member may be made of a metal. This improves heat dissipation more effectively.

In an electronic component according to a preferred embodiment of the present invention, the connecting member may be bonding wire. This improves heat dissipation more effectively.

In an electronic component according to a preferred embodiment of the present invention, the electronic component element may include a substrate including seventh and eighth main surfaces, a support member including a cavity provided on the eighth main surface of the substrate, and a cover member disposed on the support member so as to cover the cavity of the support member. A hollow portion may be provided by the substrate, the support member, and the cover member. The seventh main surface of the substrate may be the first main surface of the electronic component element. Heat dissipation is effectively improved even in an electronic component with a hollow portion.

In an electronic component according to a preferred embodiment of the present invention, a width of the eighth main surface of the substrate and a width of the cover member may be smaller than a width of the seventh main surface of the substrate. Thus, it is unlikely that the heat-dissipation accelerating member will contact the eighth main surface of the substrate when disposing the heat-dissipation accelerating member on the substrate. The heat-dissipation accelerating member is therefore able to be electrically insulated from the circuit of the electronic component element more reliably. It is therefore possible to improve heat dissipation without impairing the functions of the electronic component.

In an electronic component according to a preferred embodiment of the present invention, side surfaces connecting the seventh and eighth main surfaces of the substrate may be tapered so that the width of the eighth main surface of the substrate is smaller than the width of the seventh main surface of the substrate. Thus, the heat-dissipation accelerating member is able to be electrically insulated from the circuit of the electronic component element more reliably.

In an electronic component according to a preferred embodiment of the present invention, step sections may be provided on side surfaces connecting the seventh and eighth main surfaces of the substrate so that the width of the eighth main surface of the substrate is smaller than the width of the seventh main surface of the substrate. The heat-dissipation accelerating member may extend from the seventh main surface of the substrate so as to reach a portion of the step sections on the side surfaces. The width of the cover member may be smaller than the width of the seventh main surface of the substrate. The heat-dissipation accelerating member may be neither disposed on the cover member nor on portions of the step sections having a smaller width. The heat-dissipation accelerating member is thus able to be electrically insulated from the circuit of the electronic component element more reliably. Additionally, the area of the heat-dissipation accelerating member is increased, thus effectively improving heat dissipation.

In an electronic component according to a preferred embodiment of the present invention, the substrate may be a piezoelectric substrate, and at least one IDT electrode may be provided on the second main surface of the substrate. The IDT electrode is able to be a heat generating source, in which case, heat dissipation is effectively improved.

In an electronic component according to a preferred embodiment of the present invention, the electronic component element may be a surface acoustic wave element.

In an electronic component according to a preferred embodiment of the present invention, the electronic component element may include a substrate defined by a piezoelectric body. The substrate may include seventh and eighth main surfaces. At least one IDT electrode may be provided on the eighth main surface of the substrate. The seventh main surface of the substrate may be the first main surface of the electronic component element. The electronic component element may not include a hollow portion.

In an electronic component according to a preferred embodiment of the present invention, the heat-dissipation accelerating member may include a material having a higher toughness than a material of the substrate. The heat-dissipation accelerating member is thus unlikely to be broken.

In an electronic component according to a preferred embodiment of the present invention, a region where the heat-dissipation accelerating member is disposed may be superposed on at least one of the at least one IDT electrode, in a plan view of the heat-dissipation accelerating member. This configuration decreases the distance between the IDT electrode, which is a heat generating source, and the heat-dissipation accelerating member. The path for heat dissipation to the exterior is thus able to be made shorter, thus improving heat dissipation more effectively.

In an electronic component according to a preferred embodiment of the present invention, the region where the heat-dissipation accelerating member is disposed may be superposed on all IDT electrodes of the at least one IDT electrode, in a plan view of the heat-dissipation accelerating member. When heat is transferred from the IDT electrodes to the heat-dissipation accelerating member via the piezoelectric substrate, it is not transferred in the planar direction of the piezoelectric substrate. This structure is able to quickly transfer heat from the plurality of IDT electrodes to the heat-dissipation accelerating member. It is thus possible to effectively improve heat dissipation.

In an electronic component according to a preferred embodiment of the present invention, the electronic component element may be mounted on the mounting substrate via a bump, and the bump may be disposed at a position superposed on the heat-dissipation accelerating member in a plan view of the heat-dissipation accelerating member. Heat transferred from the IDT electrodes to the piezoelectric substrate and then diffused in the planar direction of the piezoelectric substrate is able to be transferred to the exterior via the heat-dissipation accelerating member and the bump. That is, more paths to the exterior are provided for heat diffused in the planar direction of the piezoelectric substrate, thus improving heat dissipation more effectively.

A manufacturing method for an electronic component according to a preferred embodiment of the present invention includes a step of preparing an electronic component element according to one of the above-described preferred embodiments of the present invention and including first and second main surfaces; a step of providing a heat-dissipation accelerating member defined by a conductor on the first main surface of the electronic component element; a step of mounting the electronic component element at the second main surface on the mounting substrate; a step of providing a sealing resin layer so as to seal the electronic component element and the heat-dissipation accelerating member; a step of exposing the heat-dissipation accelerating member by removing a portion of the sealing resin layer which is superposed on the heat-dissipation accelerating member in a plan view of the sealing resin layer; a step of forming a connecting member on a portion of the heat-dissipation accelerating member which is not covered by the sealing resin layer; and a step of forming a shielding member on the connecting member and on the sealing resin layer.

In a manufacturing method according to a preferred embodiment of the present invention, in the step of exposing the heat-dissipation accelerating member, part of the portion of the sealing resin layer which is superposed on the heat-dissipation accelerating member in a plan view of the sealing resin layer may be removed. The path for heat dissipation to the exterior is thus able to be made shorter at the portion opened by removing the sealing resin layer, thus improving heat dissipation more effectively.

In a manufacturing method according to a preferred embodiment of the present invention, in the step of exposing the heat-dissipation accelerating member, the sealing resin layer may be removed by applying laser light. The step is thus simplified, and the productivity is effectively improved.

In a manufacturing method according to a preferred embodiment of the present invention, in the step of exposing the heat-dissipation accelerating member, the sealing resin layer may be removed by etching.

In a manufacturing method according to a preferred embodiment of the present invention, the forming of the connecting member and the forming of the shielding member may be performed in the same step. The steps are thus simplified, and the productivity is effectively improved.

In a manufacturing method according to a preferred embodiment of the present invention, the manufacturing method includes a step of preparing the electronic component element configured according to a preferred embodiment of the present invention and including first and second main surfaces; a step of providing a heat-dissipation accelerating member defined by a conductor on the first main surface of the electronic component element; a step of mounting the electronic component element at the second main surface on the mounting substrate; a step of providing a connecting member on the heat-dissipation accelerating member; a step of providing a sealing resin layer so as to seal the electronic component element, the heat-dissipation accelerating member, and the connecting member; a step of exposing the connecting member by removing a portion of the sealing resin layer; and a step of forming a shielding member on the connecting member and on the sealing resin layer.

In a manufacturing method according to a preferred embodiment of the present invention, in the step of providing the connecting member on the heat-dissipation accelerating member, the connecting member, which is bonding wire, may be bonded onto the heat-dissipation accelerating member. This improves heat dissipation more effectively.

In a manufacturing method according to a preferred embodiment of the present invention, in the step of exposing the connecting member, the sealing resin layer may be removed by grinding. With this configuration, the sealing resin layer and the exposed portion of the connecting member are able to be flush with each other. The shielding member is thus able to be formed flat. This makes it possible to easily attract the electronic component by suction, for example, and to transfer it, thus effectively improving the productivity.

In a manufacturing method according to a preferred embodiment of the present invention, in the step of providing the heat-dissipation accelerating member on the first main surface of the electronic component element, the electronic component element and the heat-dissipation accelerating member may be bonded to each other by using a bonding agent. This improves the bonding strength between the electronic component element and the heat-dissipation accelerating member.

In a manufacturing method according to a preferred embodiment of the present invention, in the step of mounting the electronic component element on the mounting substrate, a bump may be provided at a portion of the second main surface of the electronic component element which is superposed on the heat-dissipation accelerating member in a plan view of the second main surface of the electronic component element, and the electronic component element may be mounted on the mounting substrate via the bump. With this configuration, more paths to the exterior are able to be provided for heat diffused in the planar direction of the piezoelectric substrate. It is thus possible to improve heat dissipation more effectively.

In a manufacturing method according to a preferred embodiment of the present invention, in the step of forming the shielding member, the shielding member may be formed to cover an external area of the sealing resin layer so that the sealing resin layer is not exposed to the exterior. This configuration enables the shielding member to exhibit electromagnetic shielding characteristics more properly. Additionally, a large area of the shielding member contacts the exterior, thus improving heat dissipation more effectively.

According to various preferred embodiments of the present invention, an electronic component is provided that exhibits high heat dissipation characteristics and a manufacturing method for the electronic component.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be described below in detail with reference to the drawings and specific preferred embodiments of the present invention.

The preferred embodiments disclosed in this specification are only examples, and the configuration in one preferred embodiment may partially be replaced by or combined with the configuration in another preferred embodiment, for example.

Figure 1A:
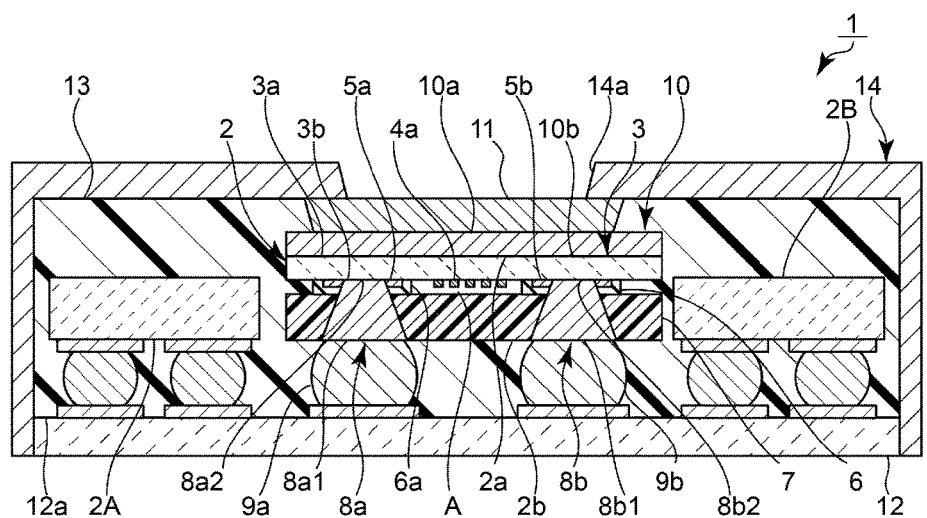
FIG. 1A is a sectional front view of an electronic component according to a first preferred embodiment of the present invention.

FIG. 1A is a sectional front view of an electronic component according to a first preferred embodiment of the present invention.

An electronic component 1 includes an electronic component element 2 mounted on a mounting substrate 12. More specifically, the electronic component element 2 includes first and second main surfaces 2a and 2b. The mounting substrate 12 includes a third main surface 12a opposing the second main surface 2a of the electronic component element 2. The electronic component element 2 is mounted at the second main surface 2b on the third main surface 12a of the mounting substrate 12 via bumps 9a and 9b. On the mounting substrate 12, elements other than the electronic component element 2, such as elements 2A and 2B, may also be mounted. The elements 2A and 2B, may preferably be a chip capacitor and a chip inductor, for example.

The electronic component element 2 includes a piezoelectric substrate 3 on the side of the first main surface 2a. The piezoelectric substrate 3 includes seventh and eighth main surfaces 3a and 3b. In this preferred embodiment, the first main surface 2a of the electronic component element 2 is the seventh main surface 3a of the piezoelectric substrate 3. The piezoelectric substrate 3 is preferably made of piezoelectric single crystal or piezoelectric ceramics, for example.

Figure 1B:
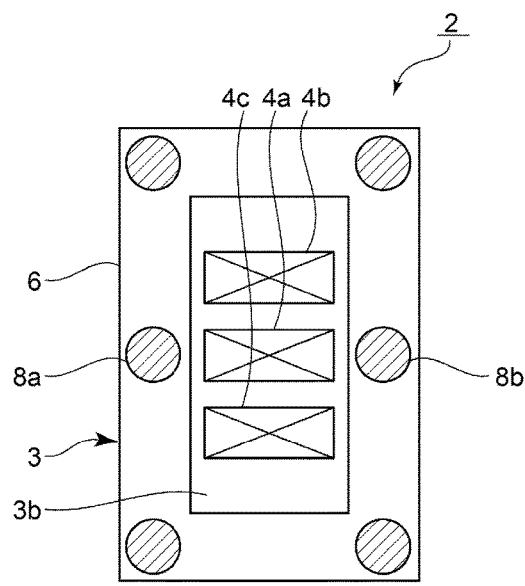
FIG. 1B is a sectional plan view of an electronic component element in the first preferred embodiment and is also a sectional plan view of a cross section between a cover member and a support member, as viewed from a second main surface of a piezoelectric substrate.

FIG. 1B is a sectional plan view of the electronic component element in the first preferred embodiment and is also a sectional plan view of a cross section between a cover member and a support member, as viewed from the second main surface of the piezoelectric substrate.

On the eighth main surface 3b of the piezoelectric substrate 3, a plurality of IDT electrodes 4a, 4b, and 4c are provided. On the eighth main surface 3b of the piezoelectric substrate 3, a support member 6 surrounds the plurality of IDT electrodes 4a, 4b, and 4c. The support member 6 preferably has a frame shape, for example.

Referring back to FIG. 1A, electrode pads 5a and 5b are provided on the eighth main surface 3b of the piezoelectric substrate 3. The electrode pads 5a and 5b are covered with the support member 6. A cover member 7 is provided on the support member 6 to cover a cavity 6a of the support member 6. A hollow portion A is provided by the piezoelectric substrate 3, the support member 6, and the cover member 7. The plurality of IDT electrodes 4a, 4b, and 4c shown in FIG. 1B face the hollow portion A. It is noted that providing at least one IDT electrode may be sufficient.

Under bump metal layers 8a and 8b pass through the support member 6 and the cover member 7. The under bump metal layer 8a includes first and second end portions 8a1 and 8a2. The under bump metal layer 8b includes first and second end portions 8b1 and 8b2. The second end portions 8a2 and 8b2 of the under bump metal layers 8a and 8b are respectively connected to the electrode pads 5a and 5b.

The bumps 9a and 9b are disposed on the cover member 7. The first end portions 8a1 and 8b1 of the under bump metal layers 8a and 8b are respectively connected to the bumps 9a and 9b. That is, the under bump metal layer 8a electrically connects the electrode pad 5a and the bump 9a, while the under bump metal layer 8b electrically connects the electrode pad 5b and the bump 9b.

The electronic component element 2 in this preferred embodiment is preferably, for example, a surface acoustic wave element utilizing surface acoustic waves excited by the plurality of IDT electrodes 4a, 4b, and 4c.

A planar heat-dissipation accelerating member 10 is provided on the seventh main surface 3a of the piezoelectric substrate 3, which is the first main surface 2a of the electronic component element 2. The heat-dissipation accelerating member 10 includes fourth and fifth main surfaces 10b and 10a. The fourth main surface 10b is positioned on the piezoelectric substrate 3. In this preferred embodiment, the thermal conductivity and the toughness of the heat-dissipation accelerating member 10 are higher than those of the piezoelectric substrate 3. In this preferred embodiment, the heat-dissipation accelerating member 10 is preferably primarily made of Cu, for example. The heat-dissipation accelerating member 10 is preferably defined by a multilayer body made of NiCr, Cu, and Ti layers stacked on each other in order from the piezoelectric substrate 3, for example. NiCr is an underlying layer, and Ti is a protective film which protects Cu against oxidation. The heat-dissipation accelerating member 10 is preferably made of a metal having a higher thermal conductivity and a higher toughness than the piezoelectric substrate 3, as described above. The materials for the heat-dissipation accelerating member 10 are not restricted to those described above, and the heat-dissipation accelerating member 10 may be made of any suitable conductor.

A connecting member 11 is provided on the fifth main surface 10a of the heat-dissipation accelerating member 10. The contact area between the heat-dissipation accelerating member 10 and the connecting member 11 is smaller than the area of the fifth main surface 10a of the heat-dissipation accelerating member 10. In other words, in a plan view of the fifth main surface 10a, the area of the connecting member 11 is smaller than that of the heat-dissipation accelerating member 10.

A sealing resin layer 13 is provided on the third main surface 12a of the mounting substrate 12 so as to seal the electronic component element 2 and a portion of the heat-dissipation accelerating member 10 which is not covered by the connecting member 11. The sealing resin layer 13 does not cover the main surfaces of the connecting member 11, and a portion of the fifth main surface 10a of the heat-dissipation accelerating member 10 which is not covered by the connecting member 11 contacts the sealing resin layer 13. The sealing resin layer 13 is made of any suitable insulating resin. The connecting member 11 is defined by a conductor having a higher thermal conductivity than the sealing resin layer 13. The resistivity of the sealing resin layer 13 is preferably about 10 Ω·cm or higher, and more preferably, about 100 Ω·cm or higher, for example. This makes it possible to sufficiently increase the insulating properties of the sealing resin layer 13. Typically, the resistivity of the insulating resin preferably ranges from about $1.0 \times 10^5$ Ω·cm to about $1.0 \times 10^{17}$ Ω·cm, for example.

In this preferred embodiment, the sealing resin layer 13 is preferably made of an insulating resin, and the heat-dissipation accelerating member 10 is provided only on the seventh main surface 3a of the piezoelectric substrate 3. The heat-dissipation accelerating member 10 is thus electrically insulated from the circuit of the electronic component element 2. The heat-dissipation accelerating member 10 may extend to the other surfaces, such as the side surfaces, of the piezoelectric substrate 3 if it is electrically insulated from the circuit of the electronic component element 2.

A shielding member 14 is provided on the sealing resin layer 13 to provide an electromagnetic shielding function. More specifically, the shielding member 14 is provided on the external area of the sealing resin layer 13 so that the sealing resin layer 13 is not exposed to the exterior. The shielding member 14 extends to the surface of the connecting member 11 opposite the surface connected to the heat-dissipation accelerating member 10. The shielding member 14 is opened so that the portion of the connecting member 11 opposite the surface connected to the heat-dissipation accelerating member 10 may be exposed to the exterior. The shielding member 14 and the heat-dissipation accelerating member 10 are electrically connected to each other via the connecting member 11. The shielding member 14 may be provided at least on the surface of the sealing resin layer 13 opposite the surface on the mounting substrate 12.

The shielding member 14 is connected to a ground potential, which is not shown, via the side surfaces of the mounting substrate 12. In this preferred embodiment, the shielding member 14 is preferably defined by a multilayer body of an alloy of Cu and stainless and Ti, for example. The materials for the shielding member 14 are not limited to those described above. The shielding member 14 may be made of a single metal or be defined by a multilayer body of plural metals stacked on each other.

The provision of the heat-dissipation accelerating member 10 electrically connected to the shielding member 14 via the connecting member 11 is a characteristic of this preferred embodiment. Because of this characteristic, heat dissipation is effectively improved. This will be discussed below.

The heat-dissipation accelerating member 10 defined by a conductor is provided on the first main surface 2a of the electronic component element 2. In this preferred embodiment, the contact area between the electronic component element 2 and the heat-dissipation accelerating member 10 with a high thermal conductivity is able to be sufficiently increased. The heat-dissipation accelerating member 10 is connected to the shielding member 14 via the connecting member 11 having a higher thermal conductivity than the sealing resin layer 13. It is therefore possible to effectively improve heat dissipation.

The heat-dissipation accelerating member 10 is electrically insulated from the circuit of the electronic component element 2. This makes it possible to improve heat dissipation without impairing the functions of the electronic component 1.

As described above, the shielding member 14 is partially opened, that is, the shielding member 14 includes an opening 14a, so that a portion of the connecting member 11 is able to be exposed. The path for heat dissipation to the exterior is thus able to be made shorter at the opening 14a, thus improving heat dissipation more effectively.

The sealing resin layer 13 contacts the fifth main surface 10a of the heat-dissipation accelerating member 10. The electronic component element 2 is thus able to be fixed by the sealing resin layer 13 at the first main surface 2a as well as the second main surface 2b and the side surfaces. This makes it possible to physically stabilize the electronic component element 2 effectively. Heat is also able to be released from the heat-dissipation accelerating member 10 via the sealing resin layer 13. It is therefore possible to effectively enhance heat dissipation.

Figure 2:
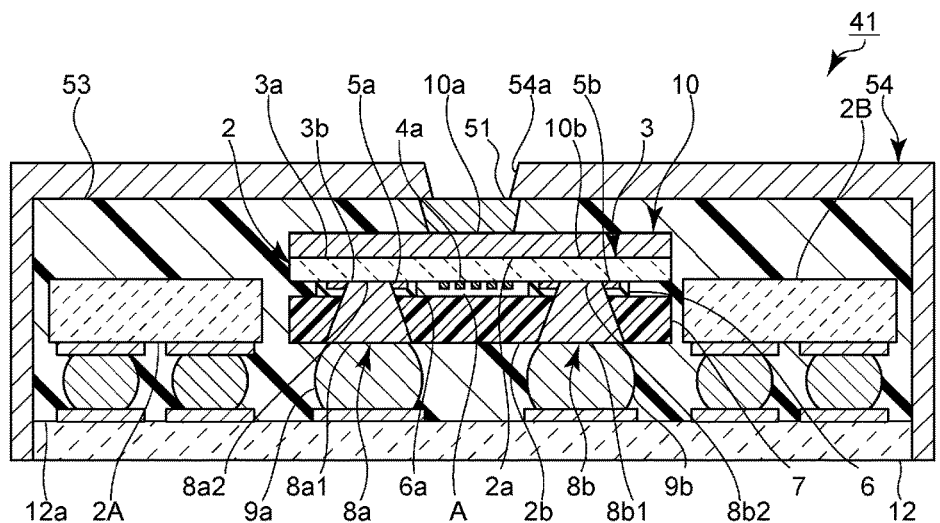
FIG. 2 is a sectional front view of an electronic component according to a first modified example of the first preferred embodiment of the present invention.

As in an electronic component 41 of a first modified example illustrated in FIG. 2, the area of a connecting member 51 may be made small, and the fifth main surface 10a of the heat-dissipation accelerating member 10 may be substantially covered with a sealing resin layer 53. An opening 54a of a shielding member 54 is small so that the shielding member 54 is able to cover the sealing resin layer 53. This makes it possible to physically stabilize the electronic component element 2 more effectively. However, the configuration of the present preferred embodiment is able to increase the contact area between the heat-dissipation accelerating member 10 and the connecting member 11 having a higher thermal conductivity than the sealing resin layer 13. This makes it possible to physically stabilize the electronic component element 2 and also to further improve heat dissipation.

In a plan view of the eighth main surface 3b of the piezoelectric substrate 3, the region where the heat-dissipation accelerating member 10 is disposed covers all the IDT electrodes 4a, 4b, and 4c shown in FIG. 1B. The heat generating source of the electronic component element 2 is the plurality of IDT electrodes 4a, 4b, and 4c. Heat is transferred from the plurality of IDT electrodes 4a, 4b, and 4c to the heat-dissipation accelerating member 10 via the piezoelectric substrate 3. This configuration enables heat to be quickly transferred from the plurality of IDT electrodes 4a, 4b, and 4c to the heat-dissipation accelerating member 10. It is therefore possible to effectively improve heat dissipation.

The piezoelectric substrate 3 on which the plurality of IDT electrodes 4a, 4b, and 4c are provided is located closer to the shielding member 14 than the mounting substrate 12 and also closer to the exposed portion of the connecting member 11. The path for heat dissipation from the heat generating source to the exterior is thus able to be made even shorter. It is therefore possible to effectively improve heat dissipation.

The region where the heat-dissipation accelerating member 10 is disposed may be superposed on at least one IDT electrode, in a plan view. However, if this region covers all the IDT electrodes 4a, 4b, and 4c in a plan view as in this preferred embodiment, heat dissipation is further improved.

The bumps 9a and 9b are located at positions at which they are superposed on the heat-dissipation accelerating member 10, in a plan view. Heat transferred from the IDT electrodes 4a, 4b, and 4c to the piezoelectric substrate 3 and then diffused in the planar direction of the piezoelectric substrate 3 is able to be transferred to the exterior via the heat-dissipation accelerating member 10, the under bump metal layers 8a and 8b, and the bumps 9a and 9b. That is, more paths to the exterior are provided for heat diffused in the planar direction of the piezoelectric substrate 3. It is therefore possible to effectively improve heat dissipation.

Figure 3:
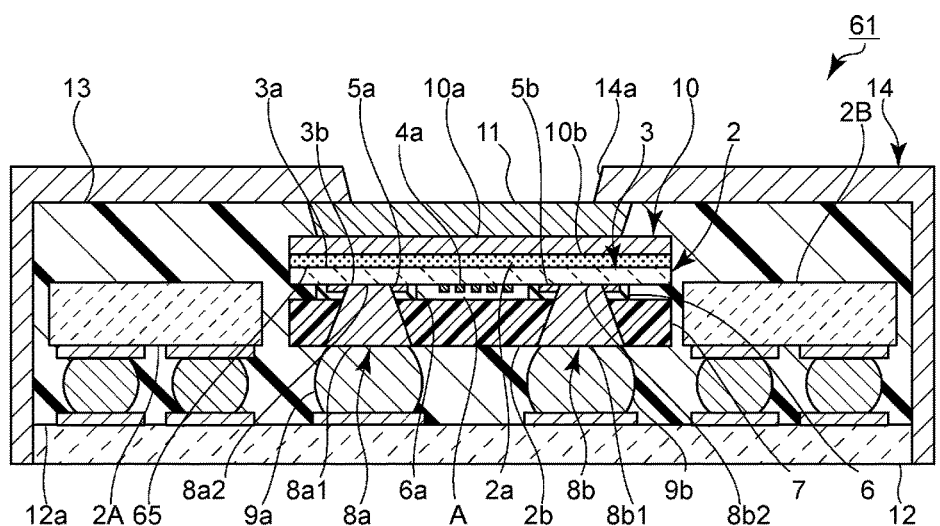
FIG. 3 is a sectional front view of an electronic component according to a second modified example of the first preferred embodiment of the present invention.

In this preferred embodiment, the heat-dissipation accelerating member 10 is directly provided on the seventh main surface 3a of the piezoelectric substrate 3. However, as in an electronic component 61 of a second modified example illustrated in FIG. 3, the heat-dissipation accelerating member 10 may be bonded to the seventh main surface 3a of the piezoelectric substrate 3 via a bonding agent 65. This improves the bonding strength between the piezoelectric substrate 3 and the heat-dissipation accelerating member 10. In this case, the bonding agent 65 is preferably a conductive bonding agent, thus improving heat dissipation. However, as in this preferred embodiment, the direct provision of the heat-dissipation accelerating member 10 on the piezoelectric substrate 3 makes the path for heat dissipation shorter, thus further improving heat dissipation.

The shielding member 14 covers the external area of the sealing resin layer 13 so that the sealing resin layer 13 is not exposed to the exterior. As described above, the shielding member 14 is connected to a ground potential via the side surfaces of the mounting substrate 12, thus exhibiting electromagnetic shielding characteristics more properly. The heat-dissipation accelerating member 10 is connected to the shielding member 14 via the connecting member 11. The heat-dissipation accelerating member 10 and the shielding member 14 are located close to each other. The path for electrical conduction between the heat-dissipation accelerating member 10 and the shielding member 14 is short. This enables the heat-dissipation accelerating member 10 to also contribute to improving electromagnetic shielding characteristics.

Figure 4:
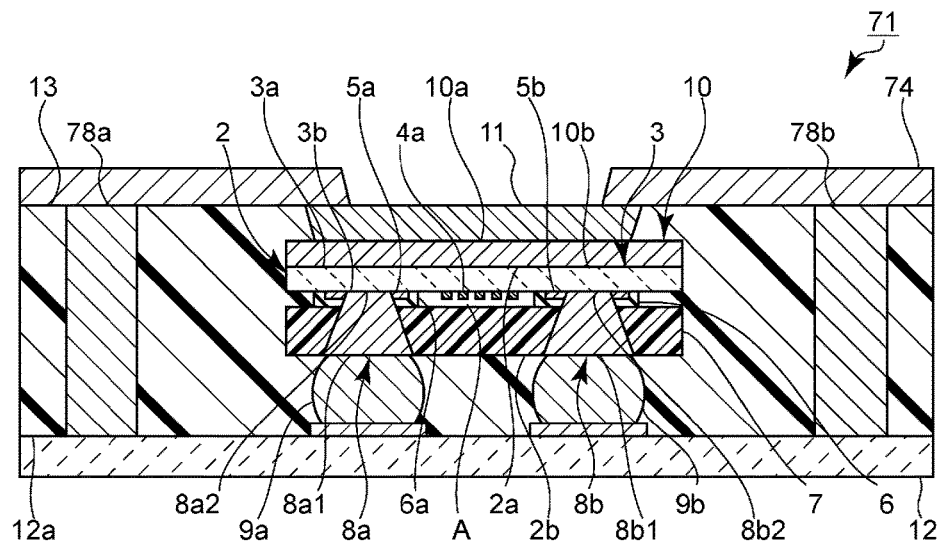
FIG. 4 is a sectional front view of an electronic component according to a third modified example of the first preferred embodiment of the present invention.

As in an electronic component 71 of a third modified example illustrated in FIG. 4, a portion of the sealing resin layer 13 facing the exterior may be exposed without a shielding member 74. In the third modified example, under bump metal layers 78a and 78b pass through the sealing resin layer 13. The shielding member 74 may be connected to a ground potential, which is not shown, via the under bump metal layers 78a and 78b. However, as in the present preferred embodiment, if the shielding member 14 covers the entirety of the sealing resin layer 13 facing the exterior, it exhibits electromagnetic shielding characteristics more properly. Additionally, a large area of the shielding member 14 contacts the exterior, thus effectively improving heat dissipation.

In the related art, an electronic component element including a hollow portion is insulated from heat by this hollow portion, and it is thus difficult to obtain sufficient heat dissipation characteristics. If the electronic component element is sealed by a sealing resin layer, it is more difficult to obtain sufficient heat dissipation characteristics. In contrast, in this preferred embodiment, heat dissipation is able to be effectively improved in the electronic component 1 including the electronic component element 2 with the hollow portion A. From this point of view, preferred embodiments of the present invention may be used more effectively for an electronic component element including a hollow portion. However, the present invention is also applicable to an electronic component including an electronic component element which does not include a hollow portion.

Figure 5:
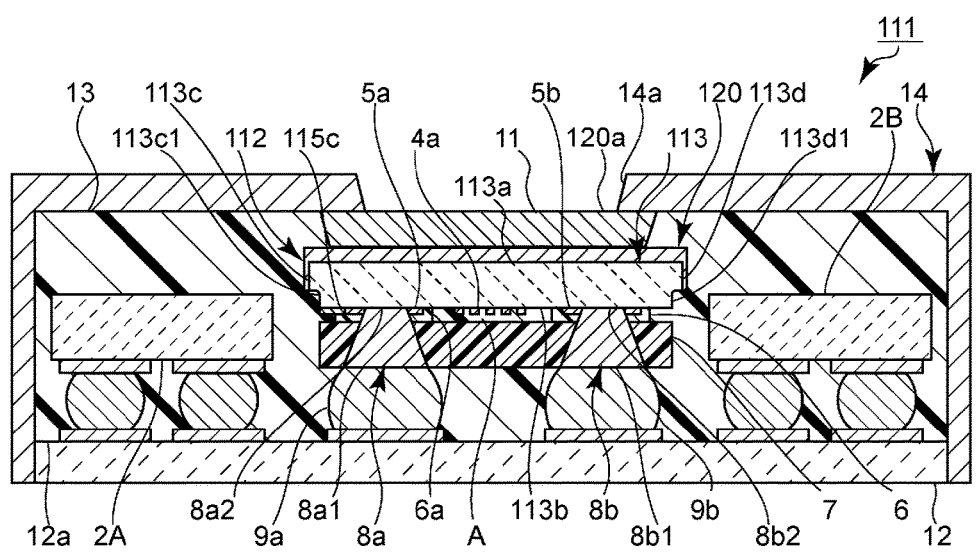
FIG. 5 is a sectional front view of an electronic component according to a second preferred embodiment of the present invention.

FIG. 5 is a sectional front view of an electronic component according to a second preferred embodiment of the present invention.

In an electronic component 111, a heat-dissipation accelerating member 120 for an electronic component element 112 extends to side surfaces 113c and 113d which connect seventh and eighth main surfaces 113a and 113b of a piezoelectric substrate 113. A direction perpendicular to the thickness direction of the electronic component element 112 in the cross section in FIG. 5 is denoted as the widthwise direction. Step sections 113c1 and 113d1 are provided on the side surfaces 113c and 113d, respectively, so that the width of the eighth main surface 113b is smaller than that of the seventh main surface 113a. The electronic component element 112 includes wiring 115c disposed on the eighth main surface 113b of the piezoelectric substrate 113 and connected to an electrode pad 5a. The wiring 115c reaches the step section 113c1. The configuration of the second preferred embodiment is similar to that of the first preferred embodiment, except for the above-described portions.

The heat-dissipation accelerating member 120 extends to the side surfaces 113c and 113d of the piezoelectric substrate 113, thus increasing the area of the heat-dissipation accelerating member 120 which contacts a sealing resin layer 13. It is therefore possible to further improve heat dissipation.

The heat-dissipation accelerating member 120 is not disposed on the step sections 113c1 and 113d1 of the side surfaces 113c and 113d of the piezoelectric substrate 113. It is thus unlikely that the heat-dissipation accelerating member 120 will contact the wiring 115c and the bumps 9a and 9b. The heat-dissipation accelerating member 120 is thus able to be electrically insulated from the circuit of the electronic component element 112 more reliably. It is therefore possible to improve heat dissipation without impairing the functions of the electronic component 111.

Figure 6:
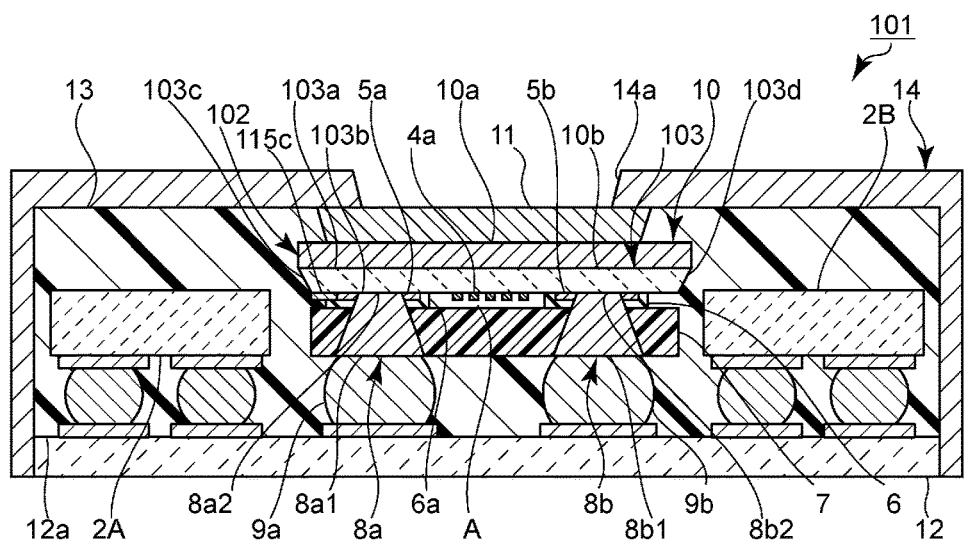
FIG. 6 is a sectional front view of an electronic component according to a modified example of the second preferred embodiment of the present invention.

As in a fourth modified example illustrated in FIG. 6, if a heat-dissipation accelerating member 10 is not provided on side surfaces 103c and 103d of a piezoelectric substrate 103, the side surfaces 103c and 103d may be tapered. More specifically, the side surfaces 103c and 103d are tapered so that the width of an eighth main surface 103b of the piezoelectric substrate 103 is smaller than that of a seventh main surface 103a. The width of a cover member 7 is also smaller than that of the seventh main surface 103a of the piezoelectric substrate 103. In this modified example, the heat-dissipation accelerating member 10 is able to be electrically insulated from the circuit of an electronic component element 102 more reliably. It is therefore possible to improve heat dissipation without impairing the functions of an electronic component 101.

Figure 7:
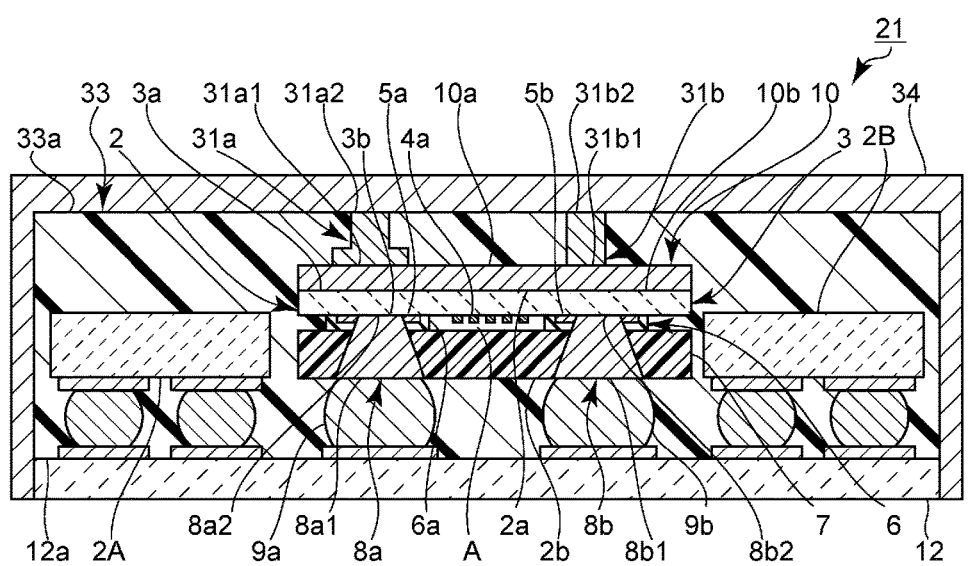
FIG. 7 is a sectional front view of an electronic component according to a third preferred embodiment of the present invention.

FIG. 7 is a sectional front view of an electronic component according to a third preferred embodiment of the present invention.

In an electronic component 21, the structures of connecting members 31a and 31b, a sealing resin layer 33, and a shielding member 34 are different from those of the first preferred embodiment. The configuration of the third preferred embodiment is similar to that of the first preferred embodiment, except for the above-described portions.

More specifically, the connecting members 31a and 31b preferably are bonding wire, for example. The connecting members 31a and 31b are electrically connected at connecting portions 31a1 and 31b1 to a heat-dissipation accelerating member 10. The connecting members 31a and 31b include connecting end portions 31a2 and 31b2 as connecting end portions electrically connected to the shielding member 34. That is, the connecting members 31a and 31b electrically connect at two portions the heat-dissipation accelerating member 10 and the shielding member 34 each other. The connecting members 31a and 31b are not exposed to the exterior. A direction perpendicular to the extending direction of the connecting member 31a from the heat-dissipation accelerating member 10 to the shielding member 34 is denoted as the widthwise direction. The width of the connecting portion 31a1 is greater than that of the other portions. The reason for this will be discussed later.

In this preferred embodiment, the connecting members 31a and 31b are preferably made of Au, for example. At least a portion of the heat-dissipation accelerating member 10 connected to the connecting members 31a and 31b is preferably made of Al, for example. Consequently, an alloy of Au and Al is preferably provided in the connecting portion 31a1, thus improving the bonding force between the connecting member 31a and the heat-dissipation accelerating member 10. The materials for the connecting members 31a and 31b and the heat-dissipation accelerating member 10 are not limited to those described above.

The sealing resin layer 33 is positioned opposite to the mounting substrate 12 side and includes a sixth main surface 33a which opposes the mounting substrate 12. The sixth main surface 33a is flush with the connecting end portions 31a2 and 31b2 of the connecting members 31a and 31b.

The shielding member 34 is provided on the connecting members 31a and 31b and on the external area of the sealing resin layer 33. The connecting members 31a and 31b and the sealing resin layer 33 are covered by the shielding member 34 so that they are not exposed to the exterior.

In this preferred embodiment, the heat-dissipation accelerating member 10 and the shielding member 34 are connected to each other by the connecting members 31a and 31b, thus effectively improving heat dissipation.

Figure 8:
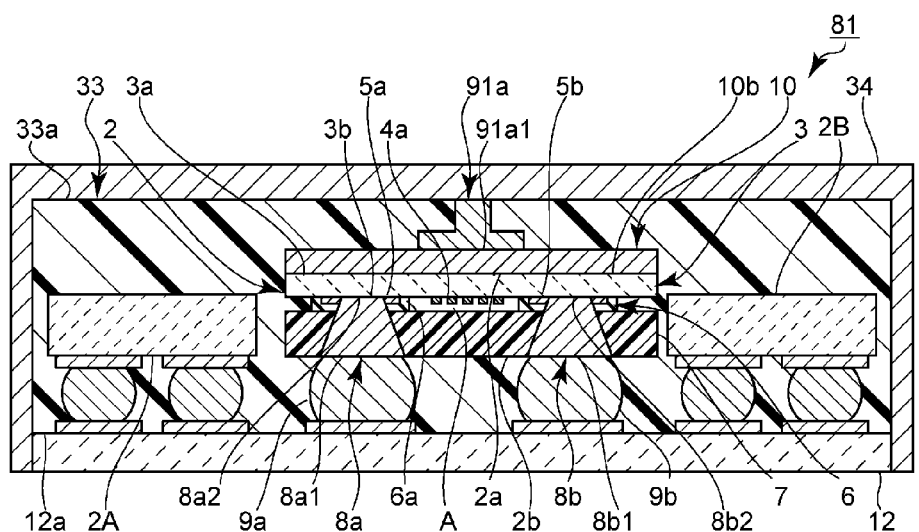
FIG. 8 is a sectional front view of an electronic component according to a modified example of the third preferred embodiment of the present invention.

As in an electronic component 81 of a fifth modified example illustrated in FIG. 8, the connecting member 31b may be omitted, and only a connecting member 91a may be provided. The connecting member 91a may be a stud bump instead of bonding wire. However, as in the present preferred embodiment, if the heat-dissipation accelerating member 10 and the shielding member 34 are connected to each other at two portions, heat dissipation is further improved, and also, the electromagnetic shielding characteristics is able to be exhibited more properly. The heat-dissipation accelerating member 10 and the shielding member 34 may be connected to each other at three or more portions by the connecting members.

The portions of the shielding member 34 provided on the sixth main surface 33a of the sealing resin layer 33 and on the connecting end portions 31a2 and 31b2 of the connecting members 31a and 31b are preferably flat or substantially flat. This makes it possible to easily attract the electronic component 21 by suction, for example, and to transfer it, thus effectively improving the productivity.

A non-limiting example of a manufacturing method for an electronic component according to a fourth preferred embodiment will be described below with reference to FIGS. 9A-9C, FIGS. 10A-10C, and FIGS. 11A-11C.

The first half steps for obtaining an electronic component element will be discussed with reference to FIGS. 9A-9C. The second half steps for obtaining the electronic component element and a step of mounting a heat-dissipation accelerating member on the electronic component element will be discussed with reference to FIGS. 10A-10C. A step of mounting the electronic component element on a mounting substrate and subsequent steps will be discussed with reference to FIGS. 11A-11C. The non-limiting manufacturing method of this preferred embodiment is a manufacturing method for the electronic component 111 of the second preferred embodiment.

Figure 9A:
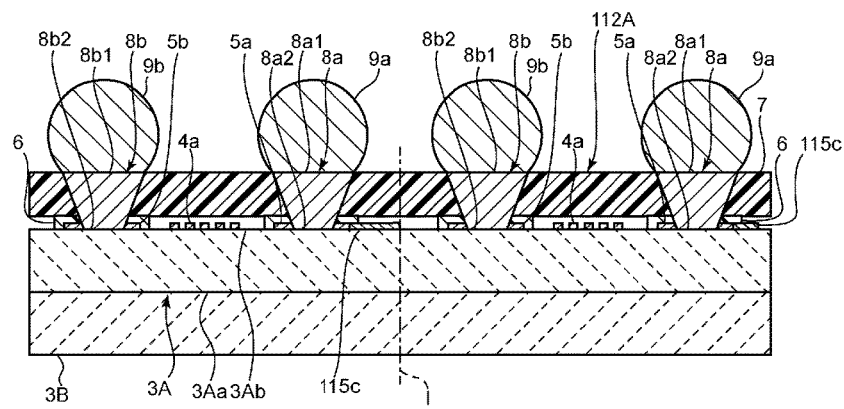
FIGS. 9A-9C are sectional front views of a manufacturing method for an electronic component according to a fourth preferred embodiment of the present invention.

First, as shown in FIG. 9A, a collective element 112A is prepared. The collective element 112A includes a collective board 3A. By dividing the collective board 3A, the piezoelectric substrate 113 illustrated in FIG. 5 is obtained. The collective board 3A includes seventh and eighth main surfaces 3Aa and 3Ab opposing each other. On the eighth main surface 3Ab of the collective board 3A, a plurality of electronic component elements 112 are shown.

Then, the collective board 3A is attached onto a holding plate 3B. The collective board 3A is held by the holding plate 3B when it is cut, as will be discussed later.

Figure 9B:
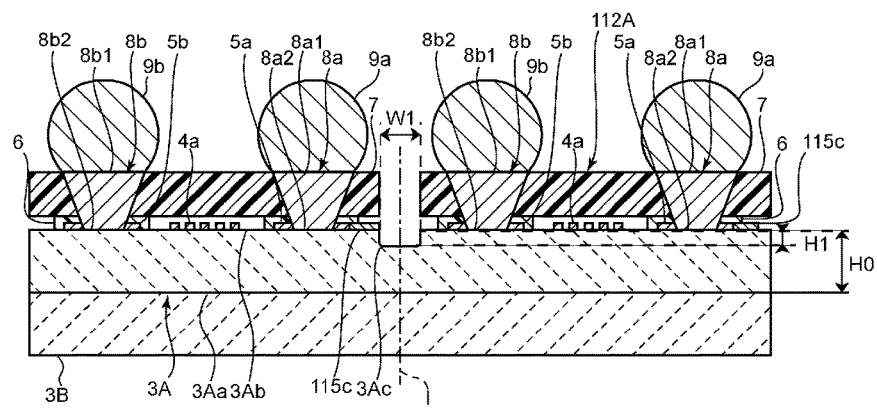

Then, as shown in FIG. 9B, the cover member 7 is cut along a dicing line 1 using a first dicing blade. Then, the eighth main surface 3Ab of the collective board 3A is cut along the dicing line 1 using the first dicing blade. As a result, a first groove 3Ac having a width W1 and a depth H1 which is shallower than a thickness H0 of the collective board 3A is formed in the collective board 3A.

Figure 9C:
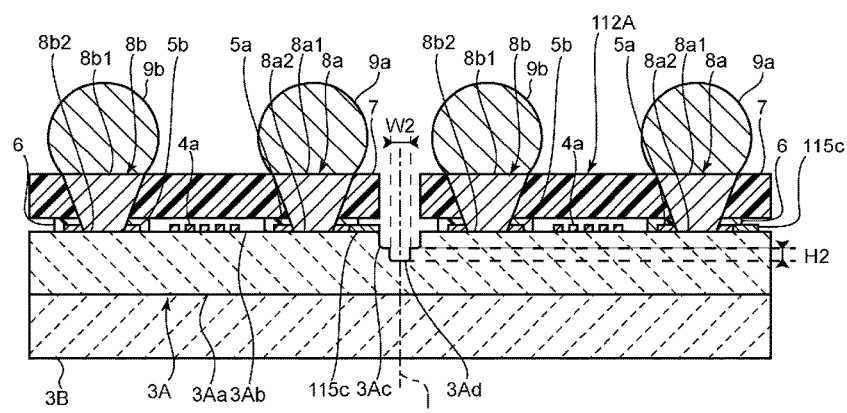

Then, as shown in FIG. 9C, the bottom portion of the first groove 3Ac is cut along the dicing line 1 by using a second dicing blade narrower than the first dicing blade. As a result, a second groove 3Ad having a depth H2 and a width W2 is formed in the collective board 3A. The depth H2 of the second groove 3Ad is shallower than the depth H1 of the first groove 3Ac. The width W2 of the second groove 3Ad is smaller than the width W1 of the first groove 3Ac. The collective board 3A is then removed from the holding plate 3B.

Figure 10A:
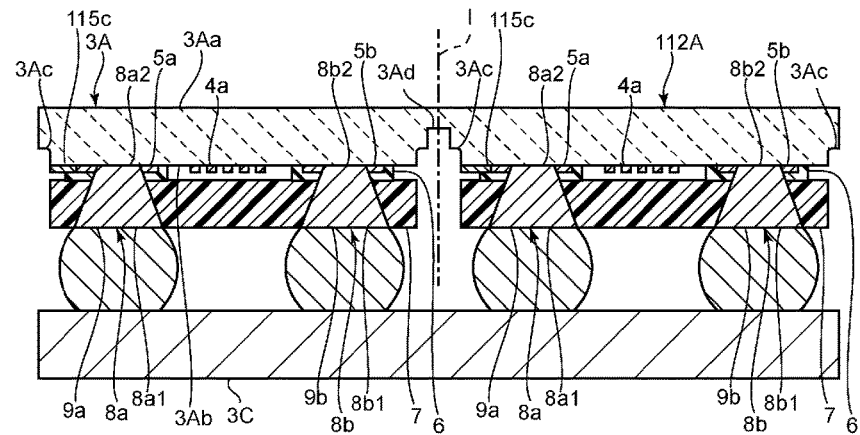
FIGS. 10A-10C are sectional front views of the manufacturing method for the electronic component according to the fourth preferred embodiment of the present invention.
Figure 10B:
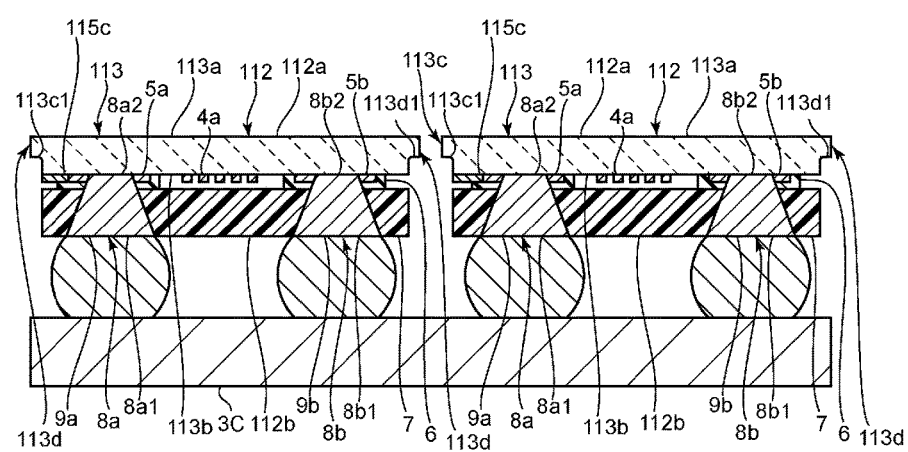

Then, as shown in FIG. 10A, bumps 9a and 9b are attached to tape 3C so as to hold the collective element 112A. Thereafter, the seventh main surface 3Aa of the collective board 3A is ground until it reaches the second groove 3Ad using a grinding wheel. This divides the collective element along the dicing line into individual elements, as shown in FIG. 10B. At this time, the step section 113c1 is able to be formed on a side surface which connects the seventh and eighth main surfaces 113a and 113b of the piezoelectric substrate 113. As a result of these steps, the electronic component element 112 divided from the collective element is formed. The step using the first dicing blade may alternatively be performed after the step of using the second dicing blade.

Figure 10C:
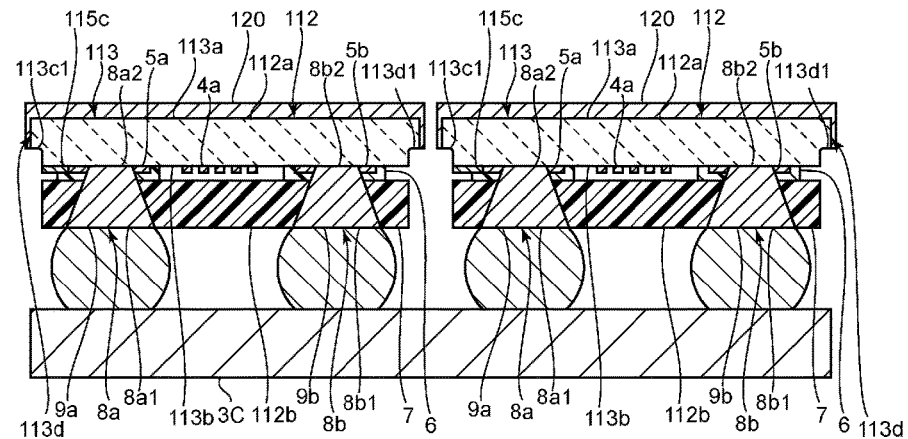

The first main surface 112a of the electronic component element 112 coincides with the seventh main surface 113a of the piezoelectric substrate 113. Then, as shown in FIG. 10C, the heat-dissipation accelerating member 120 is formed on the seventh main surface 113a of the piezoelectric substrate 113 by a metal-material vacuum deposition, for example. As the material for the heat-dissipation accelerating member 120, a metal material having a higher toughness than the material for the piezoelectric substrate 113 of the electronic component element 112 is preferably used.

Because of the step section 113c1 on the side surface of the piezoelectric substrate 113, the width of the eighth main surface 113b is smaller than that of the seventh main surface 113a. It is thus less likely that the heat-dissipation accelerating member 120 formed by vacuum deposition will extend to the element forming surface, which is the eighth main surface 113b of the piezoelectric substrate 113. It is thus unlikely that the heat-dissipation accelerating member 120 will contact the wiring 115c exposed on the eighth main surface 113b and connected to the circuit of the electronic component element 112. It is therefore possible to electrically insulate the heat-dissipation accelerating member 120 from the circuit of the electronic component element 112 more reliably.

The width of the cover member 7 is also smaller than that of the seventh main surface 113a of the piezoelectric substrate 113. The heat-dissipation accelerating member 120 is thus less likely to be formed on the cover member 7. The heat-dissipation accelerating member 120 is thus unlikely to contact the bumps 9a and 9b. It is therefore possible to electrically insulate the heat-dissipation accelerating member 120 from the circuit of the electronic component element 112 more reliably.

Regarding the electronic component element 102 illustrated in FIG. 6, the width of the eighth main surface 103b of the piezoelectric substrate 103 and that of the cover member 7 are also smaller than that of the seventh main surface 103a. Advantages similar to those discussed above are also obtained when providing the heat-dissipation accelerating member 10 on the piezoelectric substrate 103.

Figure 11A:
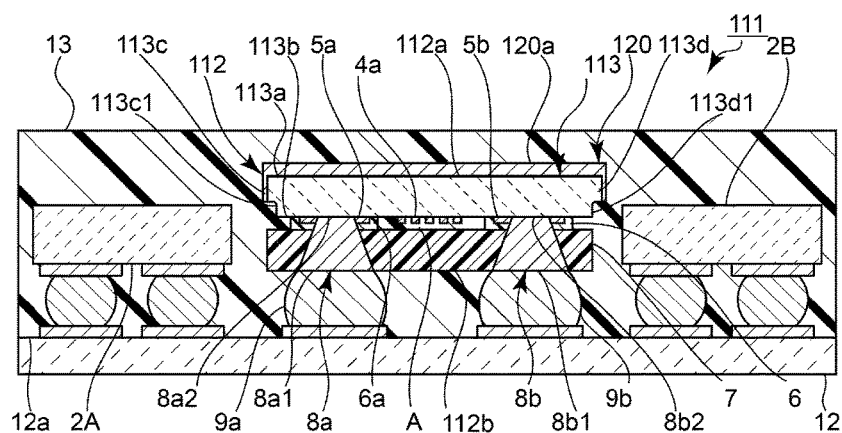
FIGS. 11A-11C are sectional front views of the manufacturing method for the electronic component according to the fourth preferred embodiment of the present invention.

Then, as shown in FIG. 11A, the electronic component element 112 is mounted at the second main surface 112b on the mounting substrate 12 via the bumps 9a and 9b.

Then, the sealing resin layer 13 is provided to seal the electronic component element 112 and the heat-dissipation accelerating member 120. The heat-dissipation accelerating member 120 contains a material having a higher toughness than the material for the piezoelectric substrate 113. Because of the presence of the heat-dissipation accelerating member 120, the piezoelectric substrate 113 is less likely to be broken when being pressed by transfer molding or insert molding. The productivity is therefore effectively improved.

Figure 11B:
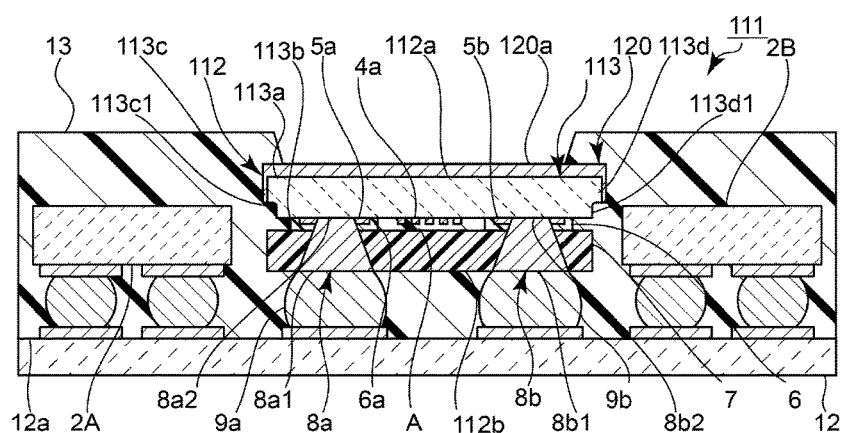

Then, by removing the portion of the sealing resin layer 13 which is superposed on the heat-dissipation accelerating member 120 in a plan view of the sealing resin layer 13, the heat-dissipation accelerating member 120 is exposed, as shown in FIG. 11B. In this preferred embodiment, the area by which the heat-dissipation accelerating member 120 is exposed is smaller than that of the fifth main surface 120a of the heat-dissipation accelerating member 120. The sealing resin layer 13 may be removed by etching, for example. Alternatively, the sealing resin layer 13 may be removed by the application of laser light.

In the related art, when removing a sealing resin layer, laser light applied to the sealing resin layer passes through a piezoelectric substrate and reaches the circuit of an electronic component element. This causes a breakage of the electronic component element. In contrast, in this preferred embodiment, because of the heat-dissipation accelerating member 120 made of a metal being provided on the seventh main surface 113a of the piezoelectric substrate 113, a breakage of an electronic component element caused by the application of laser light is less likely to occur. Consequently, laser light is able to be safely used as described above when removing the sealing resin layer 13. The step is thus simplified, and the productivity is effectively improved.

Figure 11C:
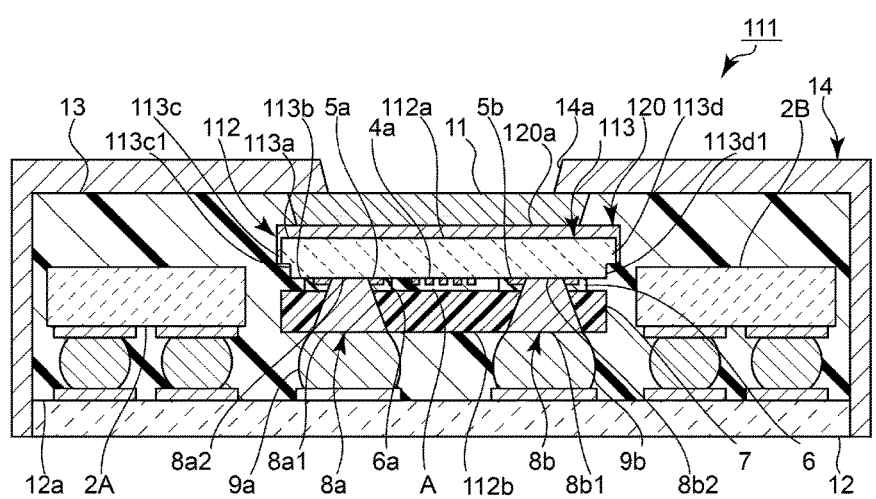

Then, as shown in FIG. 11C, the connecting member 11 is provided on the exposed portion of the heat-dissipation accelerating member 120. The area of the exposed portion of the heat-dissipation accelerating member 120 is smaller than that of the fifth main surface 120a of the heat-dissipation accelerating member 120. This makes it possible to properly connect the connecting member 11 to the heat-dissipation accelerating member 120, thus effectively improving the productivity.

Then, the shielding member 14 is formed on the connecting member 11 and on the sealing resin layer 13. The shielding member 14 is provided to cover the external area of the sealing resin layer 13. The shielding member 14 is provided so that a portion of the connecting member 11 is able to be exposed. Wiring is provided to connect the shielding member 14 to a ground potential via the side surfaces of the mounting substrate 12.

If, as in the third modified example illustrated in FIG. 4, for example, the under bump metal layers 78a and 78b are formed to pass through the sealing resin layer 13, the step becomes complicated. In contrast, in this preferred embodiment, the wiring merely being provided on the surface of the mounting substrate 12 is sufficient. The shielding member 14 is thus able to be easily connected to a ground potential, thus effectively improving the productivity.

The formation of the connecting member 11 and that of the shielding member 14 may be performed in the same step. The connecting member 11 and the shielding member 14 may preferably be formed by a sputtering or CVD process, for example. The steps are thus simplified, and the productivity is effectively improved.

Figure 12A:
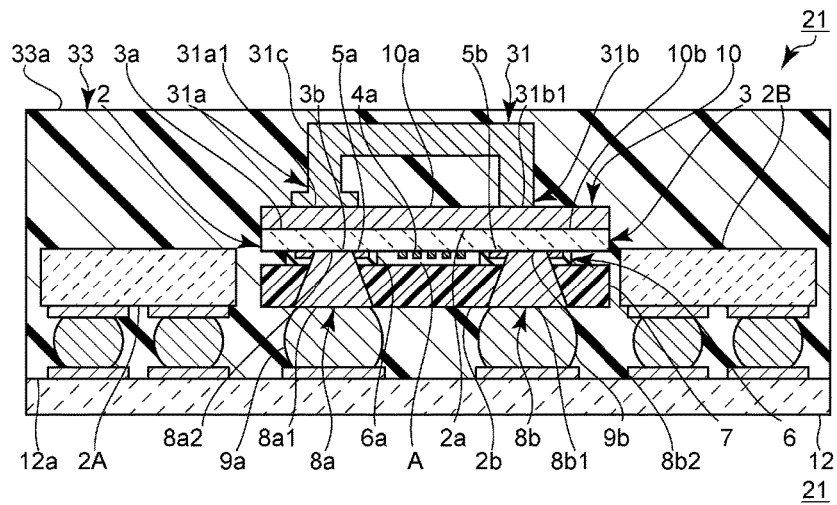
FIGS. 12A-12C are sectional front views of a manufacturing method for an electronic component according to a fifth preferred embodiment of the present invention.
Figure 12B:
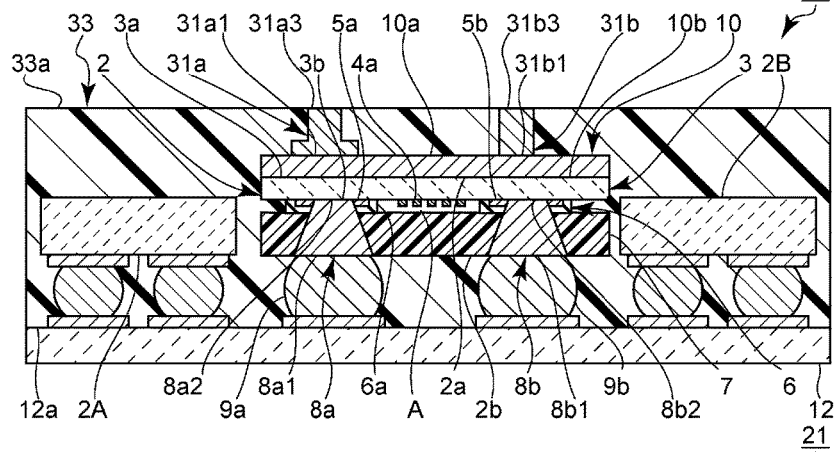
Figure 12C:
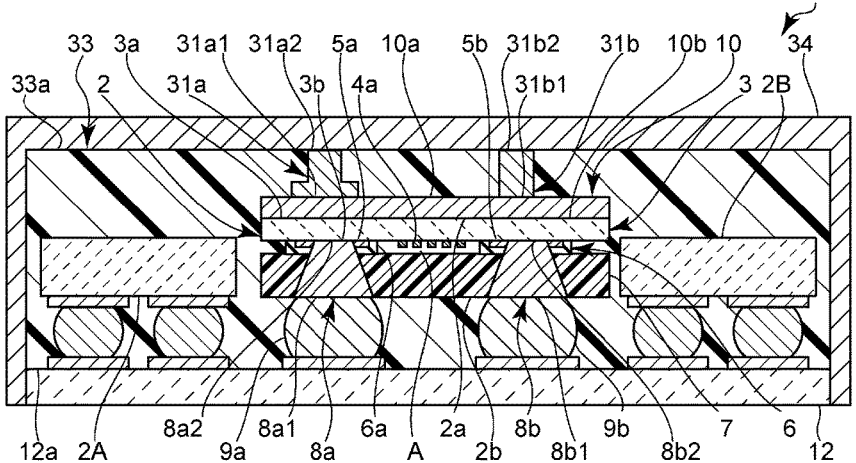

FIGS. 12A-12C are sectional front views of a manufacturing method for an electronic component according to a fifth preferred embodiment. The non-limiting manufacturing method of this preferred embodiment is a manufacturing method for the electronic component 21 of the third preferred embodiment.

This preferred embodiment is different from the fourth preferred embodiment in the steps after the heat-dissipation accelerating member 10 is provided on the first main surface 2a of the electronic component element 2.

After the heat-dissipation accelerating member 10 is provided on the first main surface 2a of the electronic component element 2, a connecting member 31, which is bonding wire, is bonded to the fifth main surface 10a of the heat-dissipation accelerating member 10. Before being bonded to the heat-dissipation accelerating member 10, one end portion of the connecting member 31 is melted to be formed into a spherical or substantially spherical shape. Then, this end portion is brought into contact with the fifth main surface 10a of the heat-dissipation accelerating member 10, and is then pressed, heated, and subjected to the application of ultrasound. This causes the end portion to be bonded to the heat-dissipation accelerating member 10. The connecting portion 31a1 is formed in this manner. As discussed above, one end portion of the connecting member 31, which functions as the connecting portion 31a1, is formed in a spherical or substantially spherical shape before being bonded. The width of the connecting portion 31a1 is thus greater than that of the other portions. Then, the connecting portion 31b1 that connects the connecting member 31 to the fifth main surface 10a of the heat-dissipation accelerating member 10 is formed such that the wire-shaped connecting member 31 includes a bending portion 31c. More specifically, the connecting member 31 is turned around to form the bending portion 31c including the connecting portion 31a1 at one end. The other end of the bending portion 31c is brought into contact with the fifth main surface 10a of the heat-dissipation accelerating member 10, and is then pressed, heated, and subjected to the application of ultrasound. The connecting portion 31b1 is formed in this manner.

As described above, when the connecting member 31 is bonded to the heat-dissipation accelerating member 10, it is pressed, heated, and subjected to the application of ultrasound. The heat-dissipation accelerating member 10 in this preferred embodiment contains a material having a high toughness, as in the fourth preferred embodiment. When the connecting member 31 is bonded to the heat-dissipation accelerating member 10, a breakage of the heat-dissipation accelerating member 10 is unlikely to occur. The productivity is therefore improved.

If a plurality of electronic components are formed at the same time, one end portion of the connecting member may be bonded to the heat-dissipation accelerating member of one electronic component, while the other end portion of the connecting member may be bonded to the heat-dissipation accelerating member of another electronic component. In this case, preferably, one of the electronic components is the electronic component 81 of the fifth modified example shown in FIG. 8, and another electronic component is an electronic component including the connecting portion 31*b*1 shown in FIG. 7 instead of the connecting portion 91*a*1 of the electronic component 81. In this case, the required quantity of connecting member 31 and the required time and effort to bond the connecting member 31 are reduced by half, thus improving the productivity.

The sealing resin layer 33 is provided to seal the electronic component element 2, the heat-dissipation accelerating member 10, and the connecting member 31. As in the fourth preferred embodiment, a breakage of the heat-dissipation accelerating member 10 when providing the sealing resin layer 33 is unlikely to occur, thus effectively improving the productivity.

Then, as shown in FIG. 12B, the sealing resin layer 33 is removed by grinding so that the connecting members 31*a* and 31*b* are exposed. More specifically, the sealing resin layer 33 and the connecting member 31 shown in FIG. 12A are ground together, so that the connecting member 31 is able to be divided and exposed to the exterior as the connecting members 31*a* and 31*b*. Exposed portions 31*a*3 and 31*b*3 are formed in this manner. The exposed portions 31*a*3 and 31*b*3 are formed flat or substantially flat by grinding. The sealing resin layer 33 is ground such that it has the sixth main surface 33*a* opposing the mounting substrate 12. The sealing resin layer 33 is also ground such that the sixth main surface 33*a* of the sealing resin layer 33 is flush with the exposed portions 31*a*3 and 31*b*3 of the connecting members 31*a* and 31*b*.

Then, as shown in FIG. 12C, the shielding member 34 is formed on the connecting members 31*a* and 31*b* and on the sealing resin layer 33. The connecting end portions 31*a*2 and 31*b*2 are thus formed as connecting end portions of the connecting members 31*a* and 31*b* electrically connected to the shielding member 34. The shielding member 34 is formed to cover the external area of the sealing resin layer 33. Wiring is then provided to connect the shielding member 34 to a ground potential via the side surfaces of the mounting substrate 12.

In the above-described preferred embodiments, the electronic component elements preferably are surface acoustic wave elements, for example. However, the electronic component elements are not restricted to surface acoustic wave elements. The electronic component elements may be elastic wave elements, such as boundary acoustic wave elements, other than surface acoustic wave elements, or may be piezoelectric elements other than elastic wave elements. Alternatively, the electronic component elements may be electronic component elements other than piezoelectric elements.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   an electronic component element including first and second main surfaces which oppose each other;
   a heat-dissipation accelerating member that is disposed on the first main surface of the electronic component element and that is defined by a conductor;
   a mounting substrate including a third main surface which opposes the second main surface of the electronic component element, the electronic component element being mounted on the mounting substrate;
   a sealing resin layer disposed on the third main surface of the mounting substrate so as to seal the electronic component element; and
   a shielding member disposed at least on a surface of the sealing resin layer opposite a surface positioned on the mounting substrate and that is electrically connected to the heat-dissipation accelerating member; wherein
   the heat-dissipation accelerating member includes a fourth main surface positioned close or adjacent to the electronic component element and a fifth main surface which opposes the fourth main surface;
   the electronic component further comprising:
      a connecting member that is disposed on the fifth main surface of the heat-dissipation accelerating member and that electrically connects at least one portion of the heat-dissipation accelerating member and the shielding member with each other, the connecting member having a higher thermal conductivity than the sealing resin layer;
   a contact area between the heat-dissipation accelerating member and the connecting member is smaller than an area of the fifth main surface of the heat-dissipation accelerating member; and
   the fifth main surface of the heat-dissipation accelerating member and the sealing resin layer are in contact with each other.

2. The electronic component according to claim 1, wherein the shielding member covers an external area of the sealing resin layer so that the sealing resin layer is not exposed to an exterior of the electronic component.

3. The electronic component according to claim 1, wherein the connecting member includes a portion which is not connected to the shielding member, and the portion of the connecting member is exposed to an exterior of the electronic component.

4. The electronic component according to claim 1, wherein
   the sealing resin layer includes a sixth main surface, which is a surface opposite to the surface positioned on the mounting substrate;
   the connecting member is not exposed to an exterior of the electronic component and includes a connecting end portion connected to the shielding member; and
   the sixth main surface and the connecting end portion are flush with each other, and the shielding member includes a portion provided on the sixth main surface and on the connecting end portion.

5. The electronic component according to claim 1, wherein the shielding member is connected to a ground potential.

6. The electronic component according to claim 1, wherein a circuit of the electronic component element and the heat-dissipation accelerating member are electrically insulated from each other.

7. The electronic component according to claim 1, further comprising:
   a bonding agent that bonds the electronic component element and the heat-dissipation accelerating member to each other.

8. The electronic component according to claim 1, wherein the heat-dissipation accelerating member is made of a metal.

9. The electronic component according to claim 1, wherein the connecting member is made of a metal.

10. The electronic component according to claim 1, wherein
the electronic component element includes a substrate including seventh and eighth main surfaces, a support member including a cavity provided on the eighth main surface of the substrate, and a cover member disposed on the support member so as to cover the cavity of the support member, a hollow portion being defined by the substrate, the support member, and the cover member; and
the seventh main surface of the substrate is the first main surface of the electronic component element.

11. The electronic component according to claim 10, wherein a width of the eighth main surface of the substrate and a width of the cover member are smaller than a width of the seventh main surface of the substrate.

12. The electronic component according to claim 11, wherein side surfaces connecting the seventh and eighth main surfaces of the substrate are tapered so that the width of the eighth main surface of the substrate becomes smaller than the width of the seventh main surface of the substrate.

13. The electronic component according to claim 12, wherein
step sections are provided on the side surfaces connecting the seventh and eighth main surfaces of the substrate so that the width of the eighth main surface of the substrate becomes smaller than the width of the seventh main surface of the substrate;
the heat-dissipation accelerating member extends from the seventh main surface of the substrate to reach a portion of the step sections on the side surfaces;
the width of the cover member is smaller than the width of the seventh main surface of the substrate; and
the heat-dissipation accelerating member is neither disposed on the cover member nor on portions of the step sections with a smaller width.

14. The electronic component according to claim 11, wherein the substrate is a piezoelectric substrate, and at least one IDT electrode is provided on the second main surface of the substrate.

15. The electronic component according to claim 1, wherein the electronic component element is a surface acoustic wave element.

16. The electronic component according to claim 1, wherein
the electronic component element includes a substrate including a piezoelectric body, the substrate including seventh and eighth main surfaces, at least one IDT electrode being provided on the eighth main surface of the substrate, the seventh main surface of the substrate being the first main surface of the electronic component element; and
the electronic component element does not include a hollow portion.

17. The electronic component according to claim 11, wherein the heat-dissipation accelerating member includes a material having a higher toughness than a material of the substrate.

18. The electronic component according to claim 15, wherein a region where the heat-dissipation accelerating member is disposed is superposed on at least one of the at least one IDT electrode, in a plan view of the heat-dissipation accelerating member.

19. The electronic component according to claim 1, wherein the electronic component element is mounted on the mounting substrate via a bump, and the bump is disposed at a position superposed on the heat-dissipation accelerating member in a plan view of the heat-dissipation accelerating member.

* * * * *